US007250641B2

(12) United States Patent
Saito et al.

(10) Patent No.: US 7,250,641 B2
(45) Date of Patent: Jul. 31, 2007

(54) NITRIDE SEMICONDUCTOR DEVICE

(75) Inventors: Wataru Saito, Kanagawa (JP); Ichiro Omura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 10/961,033

(22) Filed: Oct. 12, 2004

(65) Prior Publication Data

US 2005/0274977 A1    Dec. 15, 2005

(30) Foreign Application Priority Data

Jun. 15, 2004    (JP)    .............................. 2004-177151

(51) Int. Cl.
*H01L 31/0328*    (2006.01)
(52) U.S. Cl. ...................... 257/192; 257/194; 257/195; 257/189
(58) Field of Classification Search ...................... None
See application file for complete search history.

(56) References Cited

U.S. PATENT DOCUMENTS 5,302,840 A * 4/1994 Takikawa ................... 257/194

6,100,549 A * 8/2000 Weitzel et al. ............... 257/194
2003/0151101 A1* 8/2003 Rumennik et al. ........... 257/393
2005/0274977 A1    12/2005 Saito et al.

FOREIGN PATENT DOCUMENTS

JP    2003-17409    1/2003

OTHER PUBLICATIONS

Hiroyuki Naoi, et al., "Epitaxial Lateral Overgrowth of GaN on Selected-Area Si(1 1 1) Substrate With Nitrided Si Mask", Journal of Crystal Growth, vol. 248, 2003, pp. 573-577.
U.S. Appl. No. 11/507,493, filed Aug. 22, 2006, Saito, et al.

* cited by examiner

*Primary Examiner*—Evan Pert
*Assistant Examiner*—Tan Tran
(74) *Attorney, Agent, or Firm*—Oblon, Spivak, McClelland, Maier & Neustadt, P.C.

(57) ABSTRACT

The nitride semiconductor device according to one embodiment of the present invention comprises: a silicon substrate; a first aluminum gallium nitride ($Al_xGa_{1-x}N$ ($0 \leq x \leq 1$)) layer formed as a channel layer on the silicon substrate in an island shape; and a second aluminum gallium nitride ($Al_yGa_{1-y}N$ ($0 \leq y \leq 1$, $x<y$)) layer formed as a barrier layer of a first conductive type or i-type on the first aluminum gallium nitride layer.

13 Claims, 11 Drawing Sheets

NITRIDE SEMICONDUCTOR DEVICE

CROSS REFERENCE TO RELATED APPLICATION

The subject application is related to subject matter disclosed in Japanese Patent Application No. 2004-177151 filed on Jun. 15, 2004 in Japan to which the subject application claims priority under Paris Convention and which is incorporated herein by reference.

BACKGROUND OF THE INVENTION

1. Field of the Invention

The present invention relates to a semiconductor device used for power control, and particularly to a nitride semiconductor device such as nitride semiconductor field effect transistor or Schottky barrier diode.

2. Related Background Art

A nitride semiconductor device where gallium nitride (GaN) is used as part of materials has a larger band gap and a higher critical field as compared with a semiconductor device which does not contain gallium nitride and uses silicon (Si) as main material so that the device having a small size and a high breakdown voltage can be easily achieved. Thus, it is possible to achieve a semiconductor device having low on resistance and low loss also as a semiconductor device for power control.

In particular, an aluminum gallium nitride/gallium nitride (AlGaN/GaN) heterostructure field effect transistor (HFET) can be expected for preferable characteristics because of its simple device structure.

Since it is difficult to manufacture a substrate made of single gallium nitride in the aluminum gallium nitride/gallium nitride heterostructure, the substrate is generally formed by crystal growth on a substrate such as a sapphire substrate or a silicon carbide (SiC) substrate. Since the material such as sapphire or silicon carbide has a lattic constant relatively similar to the aluminum gallium nitride/gallium nitride heterostructure, a gallium nitride crystal film having a thickness of about several μm can be grown on the sapphire substrate or silicon carbide substrate without generation of any crack.

However, there is a problem that, since the sapphire substrate has large thermal resistance, radiation from a device formed on the substrate is difficult, and further there is a problem that the substrate having a large diameter is difficult to manufacture so that even the substrate having a small diameter on the order of 2 to 3 inches is expensive.

On the other hand, no problem occurs on the radiation from a device formed on the substrate because the silicon carbide substrate has small thermal resistance, but there is a problem that the substrate having a large diameter is difficult to manufacture like the sapphire substrate and even the substrate having a small diameter is expensive.

Totally judging, it is a probable measure that the substrate having a large diameter can be manufacture at low cost and the aluminum gallium nitride/gallium nitride heterostructure is formed using a silicon substrate having relatively small thermal resistance to manufacture the device.

However, since the lattic constant of silicon is greatly different from that of the aluminum gallium nitride/gallium nitride heterostructure, a crack due to distortion easily occurs and only a gallium nitride layer having a thickness of about 1 μm to 2 μm can be crystal-grown in order to avoid generation of crack.

Since the upper limit of the breakdown voltage of the gallium nitride layer contained device on the silicon substrate is determined depending on the thickness of the gallium nitride layer, the breakdown voltage of at most about 200 V can be secured at present, and a nitride semiconductor device having a high breakdown voltage of 600V, 1200 V, or more is difficult to achieve.

It has been proposed and known a method of forming a semiconductor layer capable of restricting warpage of a substrate when a semiconductor layer having a thermal expansion coefficient different from the substrate is formed. See Japanese Patent Application Laid-Open No. 2003-17409 Publication, for example. However, in the method disclosed in Japanese Patent Application Laid-Open No. 2003-17409 Publication, a warpage prevention layer is formed on the semiconductor layer so that a structural limitation is imposed on the semiconductor device.

Therefore, when a semiconductor layer having greatly different lattic constant or thermal expansion coefficient is formed on the semiconductor substrate having a large diameter, a problem that crack or warpage easily occurs on the substrate cannot still solved basically.

SUMMARY OF THE INVENTION

According to one embodiment of the present invention, there is provided a nitride semiconductor device comprising: a silicon substrate; a first aluminum gallium nitride ($Al_xGa_{1-x}N$ ($0 \leq x \leq 1$)) layer formed as a channel layer on the silicon substrate in an island shape; and a second aluminum gallium nitride ($Al_yGa_{1-y}N$ ($0 \leq y \leq 1$, $x<y$)) layer formed as a barrier layer of a first conductive type or i-type on the first aluminum gallium nitride layer.

DETAILED DESCRIPTION OF THE EMBODIMENTS

Figure 1:
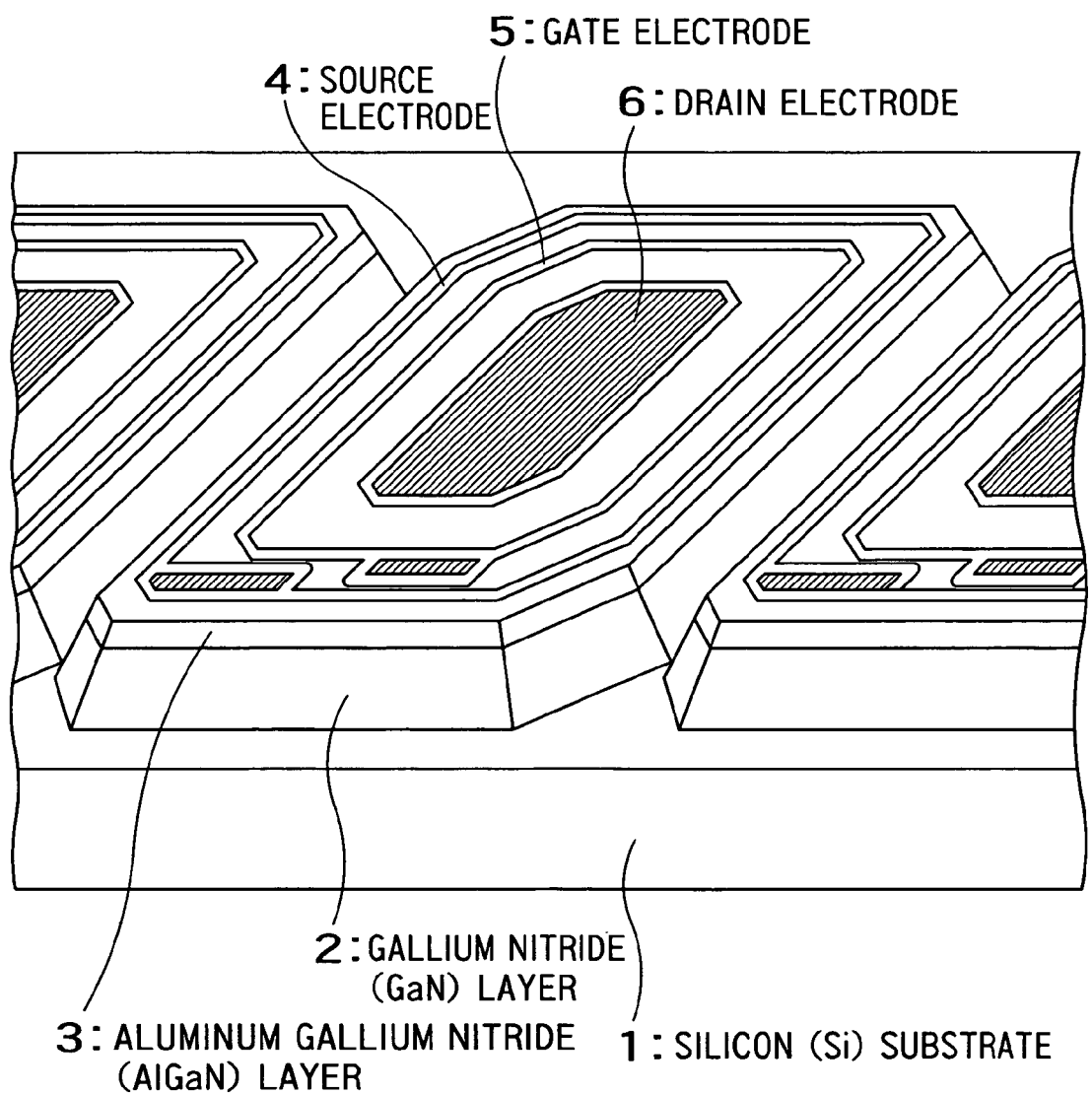
FIG. 1 is a perspective view schematically showing a structure of a nitride semiconductor device according to a first embodiment of the present invention.

Hereinafter, embodiments of a nitride semiconductor device according to the present invention will be described with reference to the drawings. The same reference numerals are denoted to like or corresponding elements in the drawings.

FIG. 1 is a perspective view schematically showing a structure of a nitride semiconductor device according to a first embodiment of the present invention.

The nitride semiconductor device according to the first embodiment of the present invention comprises a silicon (Si) substrate 1, a gallium nitride (GaN) layer 2 as a first aluminum gallium nitride ($Al_xGa_{1-x}N$ ($0 \leq x \leq 1$)) layer formed on the silicon substrate 1 in an island shape, and an aluminum gallium nitride (AlGaN) layer 3 as a second aluminum gallium nitride ($Al_yGa_{1-y}N$ ($0 \leq y \leq 1$, x<y)) layer formed on the gallium nitride layer 2.

The gallium nitride layer 2 is a semiconductor layer functioning as a channel layer, and may be formed as an i (intrinsic)-type gallium nitride layer.

The aluminum gallium nitride layer 3 is a semiconductor layer functioning as a barrier layer which supplies electrons to the channel layer, and may be formed as an n-type or i-type aluminum gallium nitride layer.

The nitride semiconductor device according to the first embodiment of the present invention further comprises a drain electrode 6 formed on the center portion of the aluminum gallium nitride layer 3, a gate electrode 5 having a circular shape formed around the drain electrode 6 on the aluminum gallium nitride layer 3, and a source electrode 4 having a circular shape formed around the gate electrode 5 on the aluminum gallium nitride layer 3.

The source electrode 4 and the drain electrode 6 are connected to the aluminum gallium nitride layer 3 as a barrier layer, respectively, and specifically form ohmic contacts with the aluminum gallium nitride layer 3, respectively.

Therefore, electrons flow from the source electrode 4 into the drain electrode 6 via a two-dimensional electron gas (2DEG) channel formed on an aluminum gallium nitride/gallium nitride (AlGaN/GaN) heterointerface.

The gate electrode 5 is also connected to the aluminum gallium nitride layer 3, and specifically forms a Schottky junction with the aluminum gallium nitride layer 3.

The source electrode 4, the gate electrode 5, and the drain electrode 6 may be made of titanium, aluminum, or the like.

As can be seen from the above structure, the nitride semiconductor device according to the first embodiment of the present invention is the aluminum gallium nitride/gallium nitride heterostructure field effect transistor (HFET).

The silicon substrate 1 is not insulative unlike a substrate made of a wide band gap semiconductor material such as gallium nitride, and is a conductive substrate. Generally, a potential of the substrate is fixed at a constant potential such as being set at a ground potential, thereby achieving a stable operation of the semiconductor device formed on the silicon substrate 1. Therefore, the silicon substrate 1 in the nitride semiconductor device according to the first embodiment of the present invention is electrically connected to the source electrode 4.

In the field effect transistor (FET), a voltage where a field between the gate electrode and the drain electrode and a field between the substrate and the drain electrode reach a critical voltage is assumed a breakdown voltage of the device. Thus, even when the distance between the gate electrode and the drain electrode is sufficiently long, when the gallium nitride layer as a channel layer is thin, the distance between the substrate and the drain electrode is short so that the field between the substrate and the drain electrode easily becomes large and a high breakdown voltage of the device cannot be achieved.

When the gallium nitride layer is crystal-grown on the entire silicon substrate, the thickness of the gallium nitride layer is about 1 μm to 2 μm, which can be formed without generating crack or distortion due to lattice mismatch between the silicon substrate and the gallium nitride layer.

The critical field of the gallium nitride layer is about 3.3 MV/cm, so that the maximum breakdown voltage of the device comprising the gallium nitride layer having the thickness of 1 μm to 2 μm as a channel layer is 330 V to 660 V.

Therefore, it is difficult to achieve a device having a high breakdown voltage of 600 V to 1200 V used for a power supply in the structure where the gallium nitride layer is crystal-grown on the entire silicon substrate.

However, it is possible to manufacture the silicon substrate having relatively small thermal resistance and having a larger diameter as compared with a sapphire substrate or a silicon carbide substrate at low cost, and thus the silicon substrate can be still used as a substrate to be used for forming the aluminum gallium nitride/gallium nitride heterostructure.

The nitride semiconductor device according to the first embodiment of the present invention employs a novel structure of crystal-growing and forming the gallium nitride layer 2 as a channel layer on the silicon substrate 1 in an island shape in order to form the gallium nitride layer having a sufficient thickness for achieving the device having a high breakdown voltage on the silicon substrate while avoiding occurrence of distortion or crack.

Though distortion or crack easily occurs due to a difference between the thermal expansion rates or lattice mismatch in the structure of crystal-growing the gallium nitride layer as a uniform film on the entire silicon substrate, the gallium nitride layer 2 is formed on the silicon substrate 1 in an island shape as in the structure of the nitride semiconductor device according to the first embodiment of the present invention so that a stress due to the difference between the thermal expansion rates or the lattice mismatch can be restricted to be small and can be released to the outside. Thus, the thick gallium nitride layer having a thickness of about 10 μm is crystal-grown to be formed even on the silicon substrate.

In other words, the device having a high breakdown voltage of 600 V to 1200 V can be achieved depending on the thickness of the gallium nitride layer 2 to be formed.

As a specific method of crystal-growing the island-shaped gallium nitride layer, it is possible to employ a selective epitaxial growth technique where a silicon nitride (SiN) film or a silicon dioxide ($SiO_2$) film is used as a mask as described in a known literature (for example, H. Naoi et al. J of Crystal Growth vol. 248, P.573-577, 2003).

In the nitride semiconductor device according to the first embodiment of the present invention, as shown in FIG. 1, the circular source electrode 4 is formed on the periphery of the aluminum gallium nitride layer 3 formed on the island-shaped gallium nitride layer 2, and the silicon substrate 1 and the source electrode 4 are electrically connected to each other. Thus, even when a high voltage is applied to the drain electrode 6, the voltage is not applied to the sidewalls of the island-shaped gallium nitride layer 2 and the aluminum gallium nitride layer 3, thereby preventing sidewall leak current.

As described above, according to the nitride semiconductor device according to the first embodiment of the present invention, there is employed the structure where the nitride semiconductor layer as a channel layer which constructs the aluminum gallium nitride ($Al_xGa_{1-x}N$ ($0 \leq x \leq 1$))/aluminum gallium nitride ($Al_yGa_{1-y}N$ ($0 \leq y \leq 1$, x<y)) heterostructure field effect transistor is formed on the silicon substrate in an island shape, so that the nitride semiconductor layer having a sufficient thickness can be formed on the silicon substrate, thereby achieving the device having a high breakdown voltage suitable for a power supply while reducing distortion of the substrate due to the difference between the thermal expansion rates or the lattice mismatch.

Figure 2:
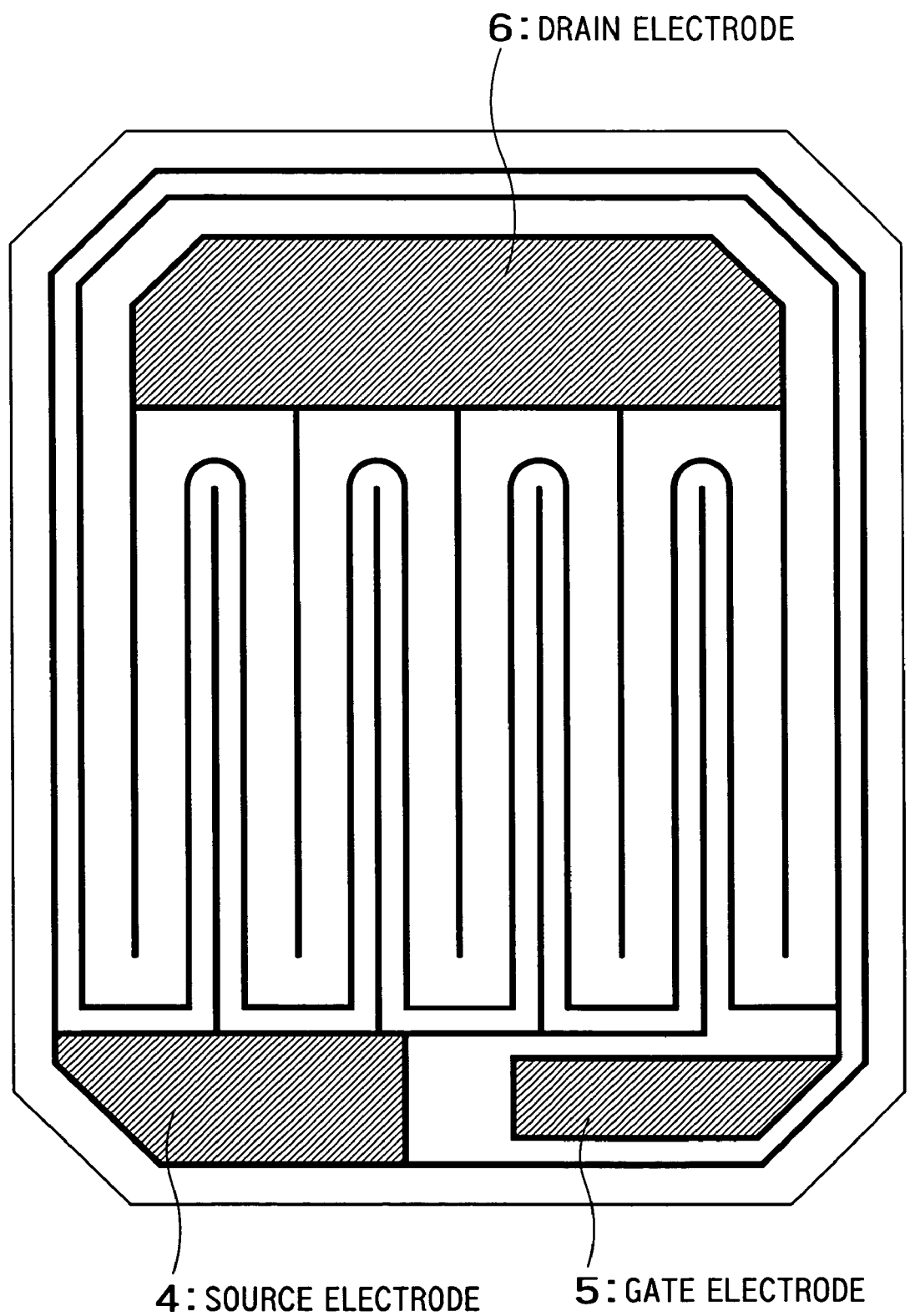
FIG. 2 is a plan view schematically showing a structure of a nitride semiconductor device according to a second embodiment of the present invention.

FIG. 2 is a plan view schematically showing a structure of a nitride semiconductor device according to a second embodiment of the present invention, and specifically a plan view where the island-shaped nitride semiconductor layer formed on the silicon substrate is viewed from above.

On the contrary to the nitride semiconductor device according to the first embodiment of the present invention shown in FIG. 1 where the drain electrode 6 is formed on the center portion of the aluminum gallium nitride layer 3, the circular gate electrode 5 is formed around the drain electrode 6, and the circular source electrode 4 is formed around the gate electrode 5, in the nitride semiconductor device according to the second embodiment of the present invention shown in FIG. 2, the source electrode 4, the gate electrode 5, and the drain electrode 6 are formed in the belt shape instead of in the circular shape.

The nitride semiconductor device according to the second embodiment of the present invention is also the aluminum gallium nitride ($Al_xGa_{1-x}N$ ($0 \leq x \leq 1$))/aluminum gallium nitride ($Al_yGa_{1-y}N$ ($0 \leq y \leq 1$, x<y)) heterostructure field effect transistor (HFET) having a similar structure as in the nitride semiconductor device according to the first embodiment of the present invention other than the shape and arrangement of the electrodes.

As shown in FIG. 2, the respective electrode are formed and arranged in the band shape, the gate width can be made larger, thereby improving a conductive capacity of the device.

Figure 3:
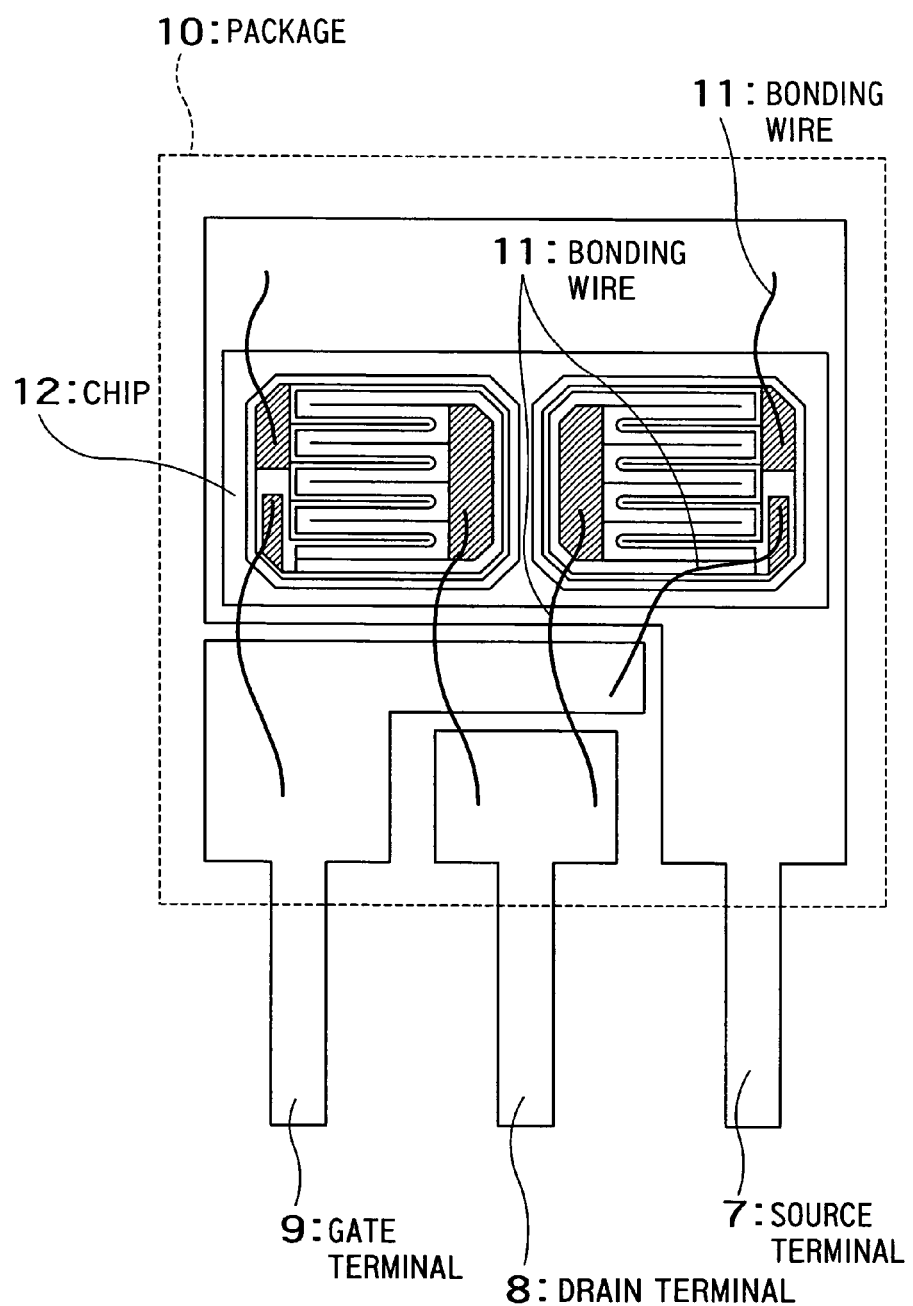
FIG. 3 is a plan view schematically showing an application example of the nitride semiconductor device according to the second embodiment of the present invention shown in FIG. 2.

FIG. 3 is a plan view schematically showing an application example of the nitride semiconductor device according to the second embodiment of the present invention shown in FIG. 2.

In the application example shown in FIG. 3, there are provided a lead frame from which a source terminal 7 is drawn, a drain electrode wiring from which a drain terminal 8 is drawn, a gate electrode wiring from which a gate terminal 9 is drawn, a semiconductor chip 12 on which two nitride semiconductor devices according to the second embodiment of the present invention are formed in the island shape and which is mounted on the lead frame, bonding wires 11 which connect the two nitride semiconductor devices in parallel by respectively connecting the source electrodes, the drain electrodes, and the gate electrodes which are formed on the two nitride semiconductor devices with the lead frame, the drain electrode wiring, and the gate electrode wiring, and a package 10 into which the semiconductor chip 12 as well as the lead frame, the drain electrode wiring, and the gate electrode wiring are enclosed in a state where the source terminal 7, the drain terminal 8, and the gate terminal 9 are exposed.

The two nitride semiconductor devices formed on the semiconductor chip 12 are indicated as the nitride semiconductor devices according to the second embodiment of the present invention in FIG. 3, but may be the nitride semiconductor devices according to the first embodiment of the present invention or nitride semiconductor devices according to each embodiment described later.

The number of nitride semiconductor devices formed on the semiconductor chip 12 may be three or more.

In this manner, a plurality of nitride semiconductor devices according to each embodiment of the present invention are connected in parallel so that a similar effect can be obtained as when the area of the devices are enlarged, thereby increasing the rated current in the entire package.

In the application example shown in FIG. 3, each connection between the source electrodes, the drain electrodes, and the gate electrodes which are formed on the two nitride semiconductor devices and the lead frame, the drain electrode wiring, and the gate electrode wiring, respectively, is formed by the bonding wires 11, but solder bump may be formed on the source electrodes, the drain electrodes, and the gate electrodes which are formed on the two nitride semiconductor devices to connect the same to the lead frame, the drain electrode wiring, and the gate electrode wiring, respectively.

A plurality of nitride semiconductor devices formed on the semiconductor chip 12 does not necessarily need to have the same electrode pattern, and may have mutually different electrode patterns.

Figure 4:
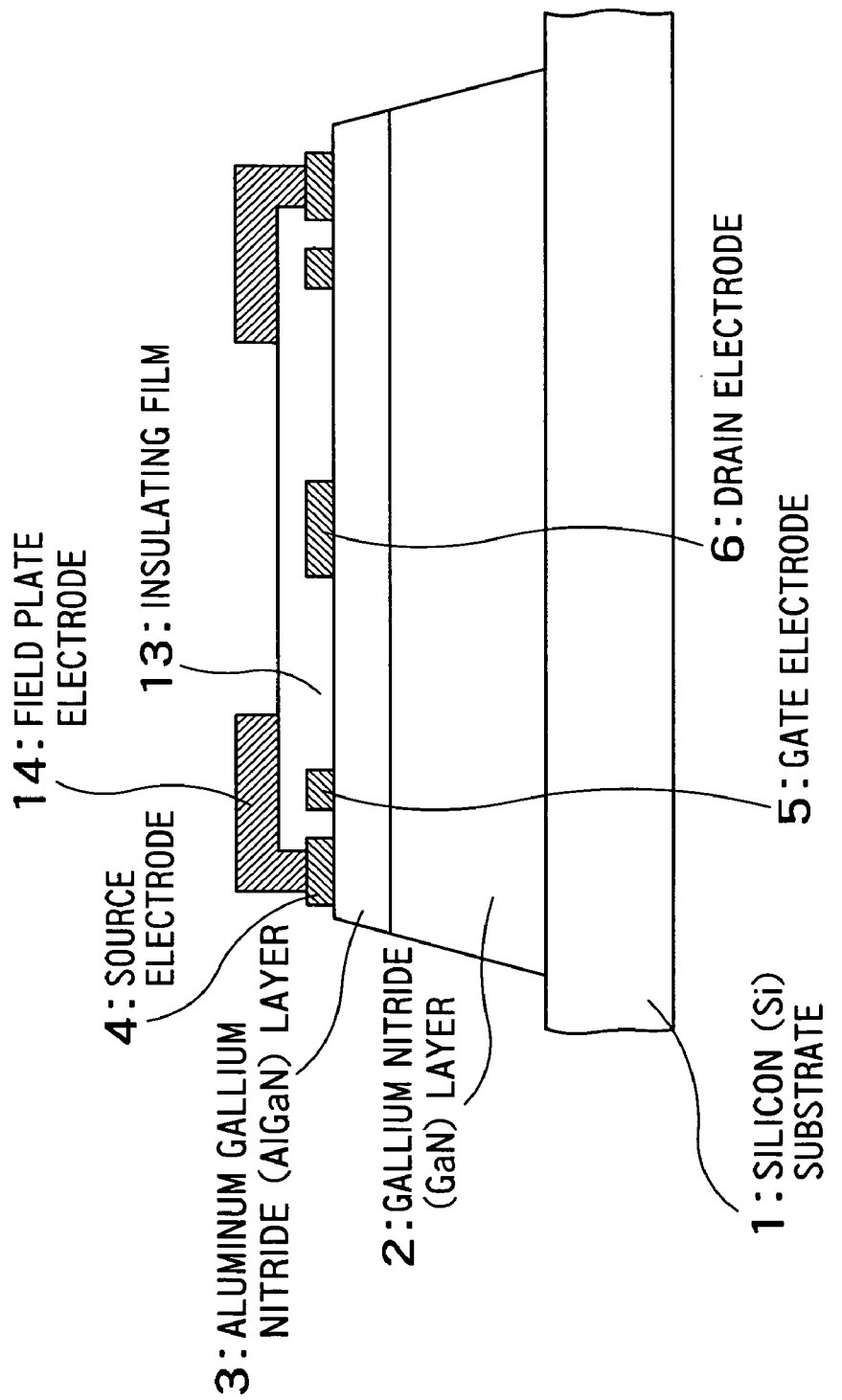
FIG. 4 is a sectional view showing a structure of a nitride semiconductor device according to a third embodiment of the present invention.

FIG. 4 is a sectional view showing a structure of a nitride semiconductor device according to a third embodiment of the present invention.

The nitride semiconductor device according to the third embodiment of the present invention is constructed so that additional constituents are added to the nitride semiconductor device according to the first embodiment of the present invention shown in FIG. 1, and comprises a silicon (Si) substrate 1, a gallium nitride (GaN) layer 2 as a first aluminum gallium nitride ($Al_xGa_{1-x}N$ ($0 \leq x \leq 1$)) layer formed on the silicon substrate 1 in an island shape, an aluminum gallium nitride (AlGaN) layer 3 as a second aluminum gallium nitride ($Al_yGa_{1-y}N$ ($0 \leq y \leq 1$, x<y)) layer formed on the gallium nitride layer 2, a drain electrode 6 formed on the center portion of the aluminum gallium nitride layer 3, a gate electrode 5 having a circular shape formed around the drain electrode 6 on the aluminum gallium nitride layer 3, a source electrode 4 having a circular shape formed around the gate electrode 5 on the aluminum gallium nitride layer 3, an insulating film 13 which covers the aluminum gallium nitride layer 3, the gate electrode 5 and the drain electrode 6, and a field plate electrode 14 which covers an area around the gate electrode 5 via the insulating film 13 and is connected to the source electrode 4.

In other words, the nitride semiconductor device according to the third embodiment of the present invention is constructed so that the insulating film 13 which covers the aluminum gallium nitride layer 3, the gate electrode 5 and the drain electrode 6, and the field plate electrode 14 which covers the area around the gate electrode 5 via the insulating film 13 and is connected to the source electrode 4 are further added to the nitride semiconductor device according to the first embodiment of the present invention shown in FIG. 1.

According to the nitride semiconductor device according to the third embodiment of the present invention, the field plate electrode 14 connected to the source electrode 4 whose electrical potential is set at a constant potential such as a ground potential functions as a shield, so that the field at the drain side end of the gate electrode 5 is alleviated, thereby achieving a further high breakdown voltage of the device.

Figure 5:
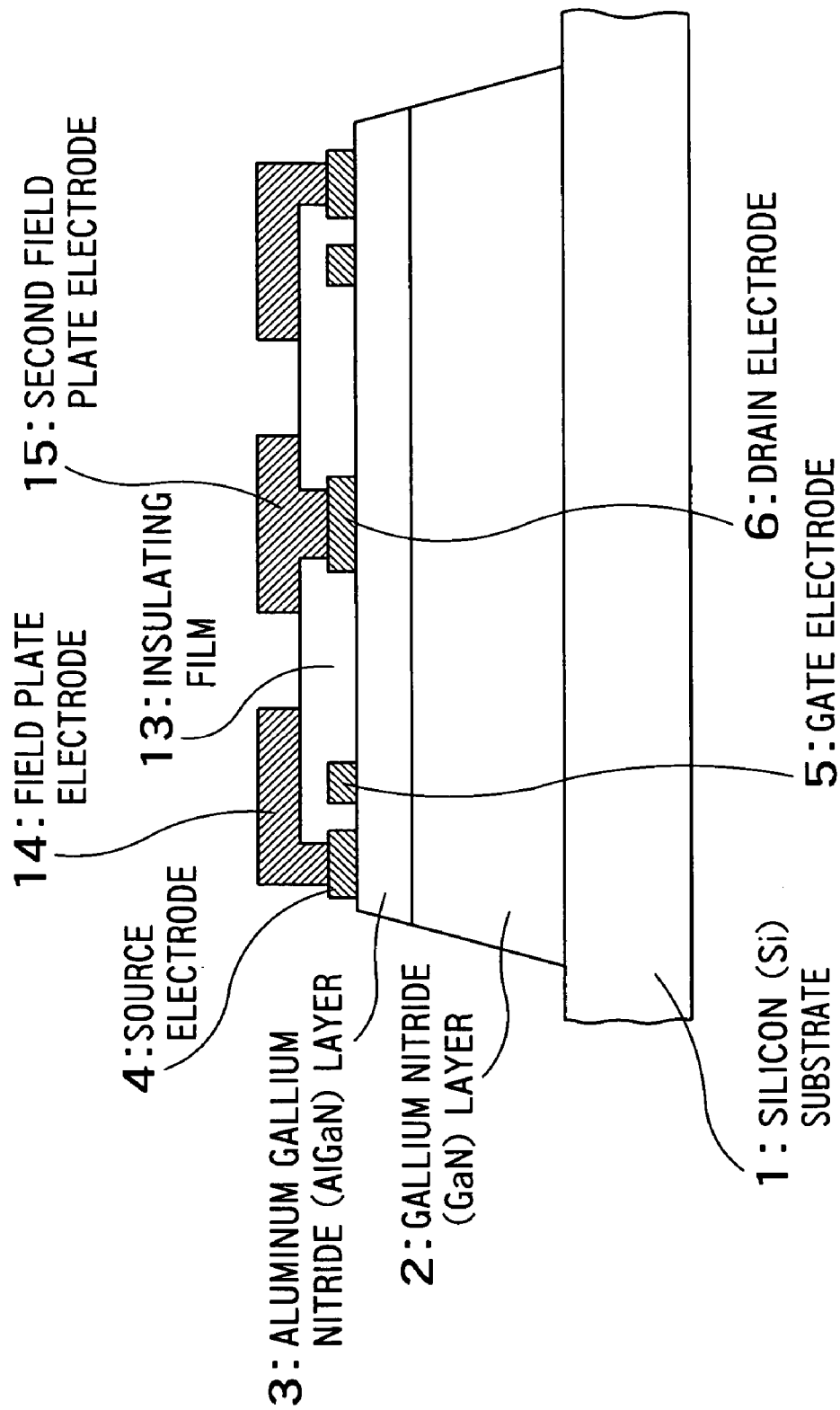
FIG. 5 is a sectional view showing a structure of a modification of the nitride semiconductor device according to the third embodiment of the present invention.

FIG. 5 is a sectional view showing a structure of a modification of the nitride semiconductor device according to the third embodiment of the present invention.

The modification shown in FIG. 5 has a structure where the nitride semiconductor device according to the third embodiment of the present invention shown in FIG. 4 is partially changed, and comprises a silicon (Si) substrate 1, a gallium nitride (GaN) layer 2 as a first aluminum gallium nitride ($Al_xGa_{1-x}N$ ($0 \leq x \leq 1$)) layer formed on the silicon substrate 1 in an island shape, an aluminum gallium nitride (AlGaN) layer 3 as a second aluminum gallium nitride ($Al_yGa_{1-y}N$ ($0 \leq y \leq 1$, x<y)) layer formed on the gallium nitride layer 2, a drain electrode 6 formed on the center portion of the aluminum gallium nitride layer 3, a gate electrode 5 having a circular shape formed around the drain electrode 6 on the aluminum gallium nitride layer 3, a source electrode 4 having a circular shape formed around the gate electrode 5 on the aluminum gallium nitride layer 3, an insulating film 13 which covers the aluminum gallium nitride layer 3, the gate electrode 5 and the drain electrode 6, a field plate electrode 14 which covers an area around the gate electrode 5 via the insulating film 13 and is connected to the source electrode 4, and a second field plate electrode 15 which covers an area around the drain electrode 6 via the insulating film 13 and is connected to the drain electrode 6.

In other words, the modification is constructed so that an opening which is formed in the portion of the insulating film 13 above the drain electrode 6 and the second field plate electrode 15 which covers the area around the drain electrode 6 via the insulating film 13 and is connected to the drain electrode 6 are added to the nitride semiconductor device according to the third embodiment of the present invention shown in FIG. 4.

According to the modification of the nitride semiconductor device of the third embodiment of the present invention, the second filed plate electrode 15 is also provided at the area around the drain electrode 6 on the insulating film 13 so that the field of the drain electrode end can be also alleviated, thereby achieving the higher breakdown voltage of the device than in the nitride semiconductor device according to the third embodiment of the present invention shown in FIG. 4.

Figure 6:
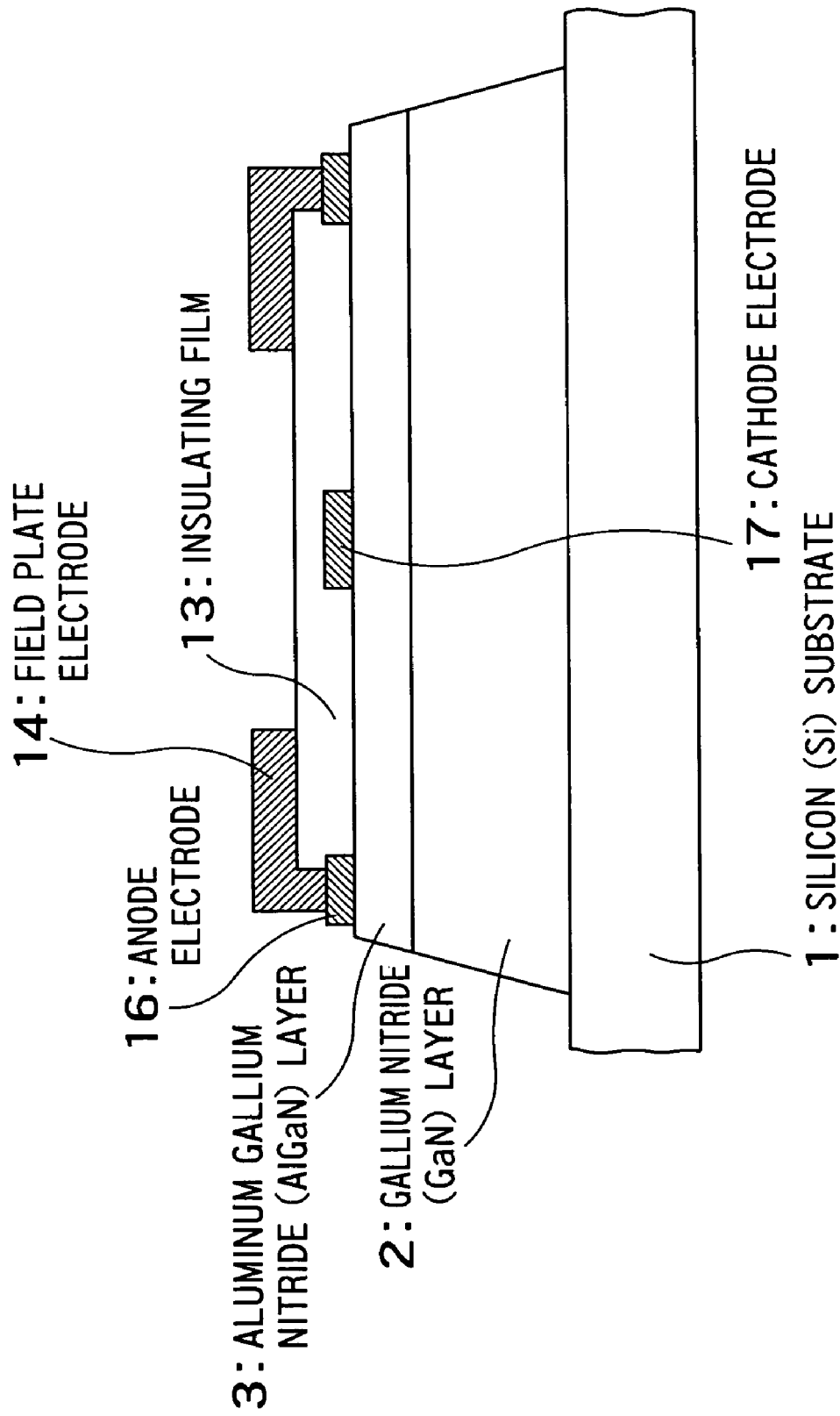
FIG. 6 is a sectional view showing a structure of a nitride semiconductor device according to a fourth embodiment of the present invention.

FIG. 6 is a sectional view showing a structure of a nitride semiconductor device according to a fourth embodiment of the present invention.

The nitride semiconductor device according to the fourth embodiment of the present invention comprises a silicon (Si) substrate 1, a gallium nitride (GaN) layer 2 as a first aluminum gallium nitride ($Al_xGa_{1-x}N$ ($0 \leq x \leq 1$)) layer formed on the silicon substrate 1 in an island shape, an aluminum gallium nitride (AlGaN) layer 3 as a second aluminum gallium nitride ($Al_yGa_{1-y}N$ ($0 \leq y \leq 1$, x<y)) layer formed on the gallium nitride layer 2, a cathode electrode 17 formed on the center portion of the aluminum gallium nitride layer 3, an anode electrode 16 having a circular shape formed near the periphery on the aluminum gallium nitride layer 3, the insulating film 13 which covers the aluminum gallium nitride layer 3 and the cathode electrode 17, and a field plate electrode 14 which covers part of the anode electrode 16 side between the anode electrode 16 and the cathode electrode 17 and is connected to the anode electrode 16.

The nitride semiconductor device according to the fourth embodiment of the present invention is structurally similar to the nitride semiconductor device according to the third embodiment of the present invention shown in FIG. 4, but the nitride semiconductor device according to the fourth embodiment of the present invention is a Schottky barrier diode (SBD) having the aluminum gallium nitride/gallium nitride heterostructure as can be seen from the fact the anode electrode 16 is formed instead of the source electrode 4, the cathode electrode 17 is formed instead of the drain electrode 6, and nothing corresponding to the gate electrode 5 is formed.

The nitride semiconductor device according to the third embodiment of the present invention shown in FIG. 4 is the aluminum gallium nitride/gallium nitride heterostructure field effect transistor (HFET), where the gate electrode 5 in FIG. 4 forms a Schottky junction with the aluminum gallium nitride layer 3 as a barrier layer so that a Schottky barrier diode is formed between the gate electrode 5 and the drain electrode 6.

Therefore, the nitride semiconductor device according to the fourth embodiment of the present invention shown in FIG. 6 is constructed similar to the nitride semiconductor device according to the third embodiment of the present invention shown in FIG. 4, thereby achieving the Schottky barrier diode with a high breakdown voltage.

In other words, in the structure shown in FIG. 6, the field plate electrode 14 connected to the anode electrode 16 which forms the Schottky junction with the aluminum gallium nitride layer 3 as a barrier layer is provided to cover part of the anode electrode 16 side between the anode electrode 16 and the cathode electrode 17, thereby achieving the high breakdown voltage of the Schottky barrier diode.

Figure 7:
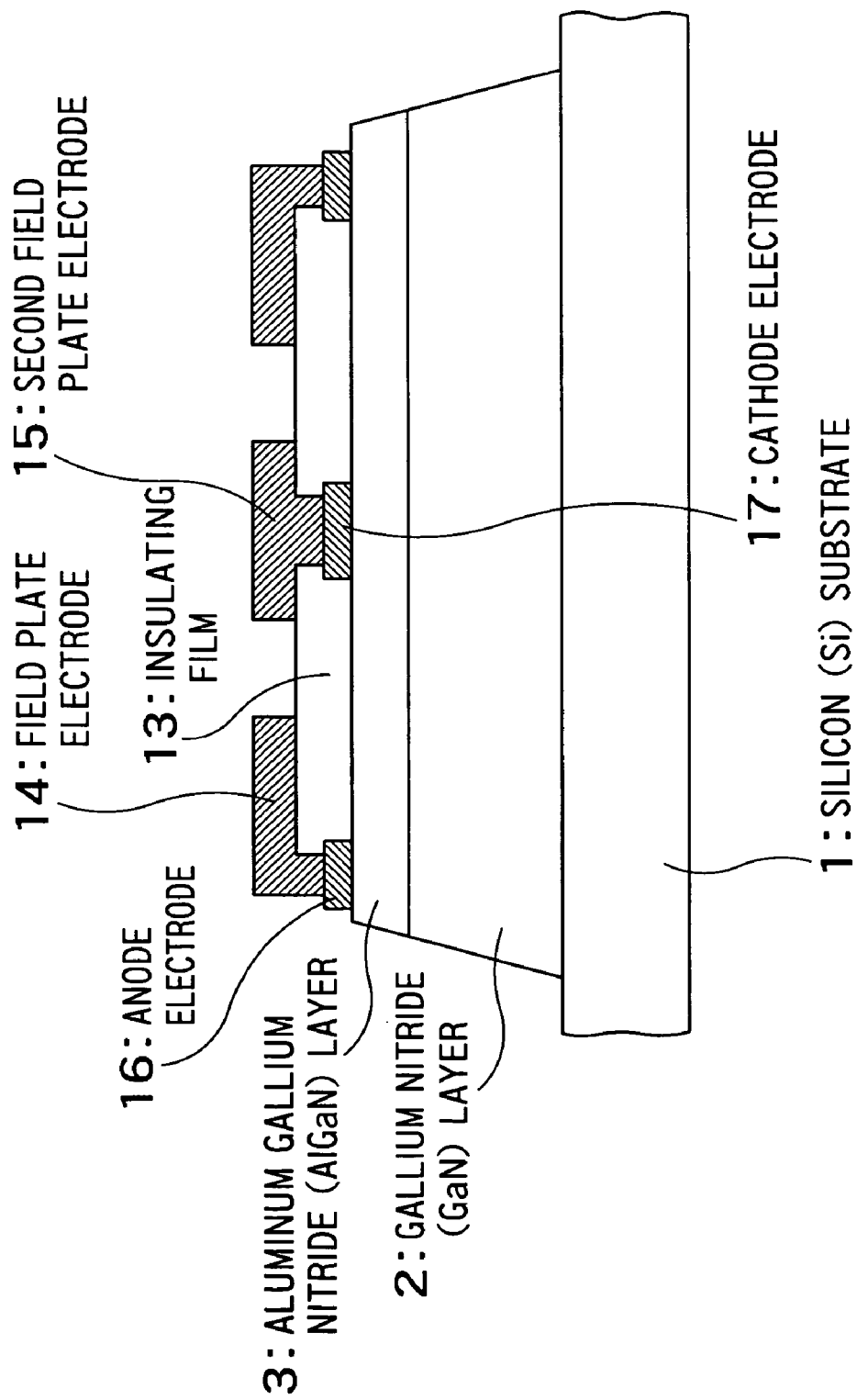
FIG. 7 is a sectional view showing a structure of a modification of the nitride semiconductor device according to the fourth embodiment of the present invention.

FIG. 7 is a sectional view showing a structure of a modification of the nitride semiconductor device according to the fourth embodiment of the present invention.

The modification shown in FIG. 7 has a structure where the nitride semiconductor device according to the fourth embodiment of the present invention shown in FIG. 6 is partially changed, and comprises a silicon (Si) substrate 1, a gallium nitride (GaN) layer 2 as a first aluminum gallium nitride ($Al_xGa_{1-x}N$ ($0 \leq x \leq 1$)) layer formed on the silicon substrate 1 in an island shape, an aluminum gallium nitride (AlGaN) layer 3 as a second aluminum gallium nitride ($Al_yGa_{1-y}N$ ($0 \leq y \leq 1$, x<y)) layer formed on the gallium nitride layer 2, a cathode electrode 17 formed on the center portion of the aluminum gallium nitride layer 3, an anode electrode 16 having a circular shape formed near the periphery on the aluminum gallium nitride layer 3, the insulating film 13 which covers the aluminum gallium nitride layer 3 and the cathode electrode 17, a field plate electrode 14 which covers part of the anode electrode 16 side between the anode electrode 16 and the cathode electrode 17 and is connected to the anode electrode 16, and a second field plate electrode 15 which covers an area around the cathode electrode 17 via the insulating film 13 and is connected to the cathode electrode 17.

In other words, the modification is constructed so that an opening which is formed in the portion of the insulating film 13 above the cathode electrode 17 and the second field plate electrode 15 which covers the area around the cathode electrode 17 via the insulating film 13 and is connected to the cathode electrode 17 are added to the nitride semiconductor device according to the fourth embodiment of the present invention shown in FIG. 6.

According to the modification of the nitride semiconductor device of the fourth embodiment of the present invention, the second field plate electrode 15 is also provided around the cathode electrode 17 on the insulating film 13 so that the field of the cathode electrode end can be alleviated, thereby achieving the higher breakdown voltage of the device than in the nitride semiconductor device according to the fourth embodiment of the present invention shown in FIG. 6.

Figure 8:
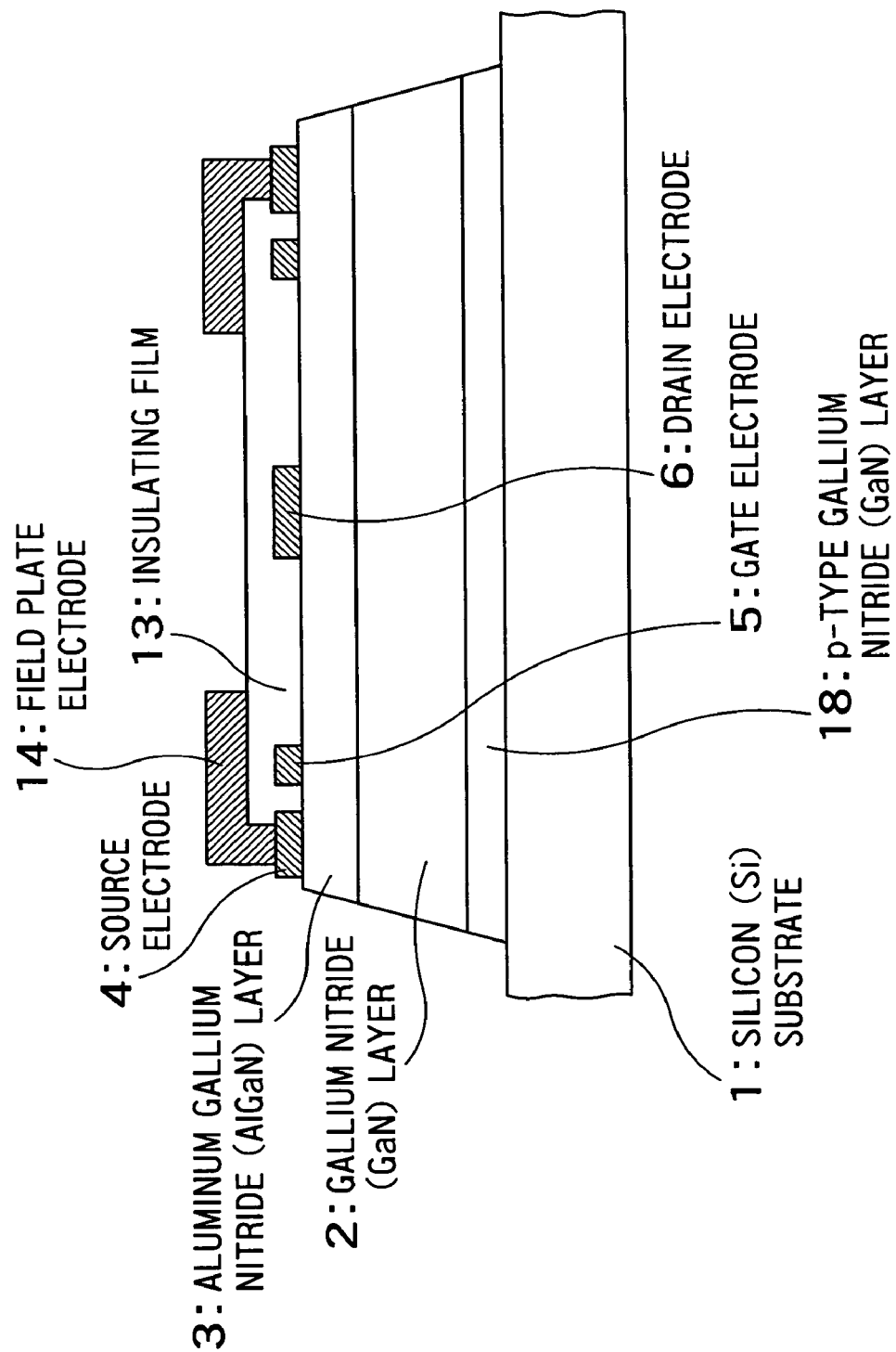
FIG. 8 is a sectional view showing a structure of a nitride semiconductor device according to a fifth embodiment of the present invention.

FIG. 8 is a sectional view showing a structure of a nitride semiconductor device according to a fifth embodiment of the present invention.

The nitride semiconductor device according to the fifth embodiment of the present invention is constructed so that additional constituents are added to the nitride semiconductor device according to the third embodiment of the present invention shown in FIG. 4, and comprises a silicon (Si) substrate 1, a p-type gallium nitride (GaN) layer 18 as a third aluminum gallium nitride ($Al_zGa_{1-z}N$ ($0 \leq z \leq 1$)) layer formed on the silicon substrate 1 in an island shape, a gallium nitride (GaN) layer 2 as a first aluminum gallium nitride ($Al_xGa_{1-x}N$ ($0 \leq x \leq 1$)) layer formed on the p-type gallium nitride (GaN) layer 18, an aluminum gallium nitride (AlGaN) layer 3 as a second aluminum gallium nitride ($Al_yGa_{1-y}N$ ($0 \leq y \leq 1$, $x<y$)) layer formed on the gallium nitride layer 2, a drain electrode 6 formed on the center portion of the aluminum gallium nitride layer 3, a gate electrode 5 having a circular shape formed around the drain electrode 6 on the aluminum gallium nitride layer 3, a source electrode 4 having a circular shape formed around the gate electrode 5 on the aluminum gallium nitride layer 3, an insulating film 13 which covers the aluminum gallium nitride layer 3, the gate electrode 5 and the drain electrode 6, and a field plate electrode 14 which covers an area around the gate electrode 5 via the insulating film 13 and is connected to the source electrode 4.

That is, the nitride semiconductor device according to the fifth embodiment of the present invention is constructed so that a p-type gallium nitride layer 18 formed on the silicon substrate 1 in an island shape is further provided and the gallium nitride layer 2, the aluminum gallium nitride layer 3, the drain electrode 6, the gate electrode 5, the source electrode 4, the insulating film 13, and the field plate electrode 14 are similarly provided thereon with respect to the nitride semiconductor device according to the third embodiment of the present invention shown in FIG. 4.

In other words, in the nitride semiconductor device according to the fifth embodiment of the present invention, the channel layer is formed of not only the gallium nitride layer 2 but the p-type gallium nitride layer 18 and the gallium nitride layer 2.

In the nitride semiconductor device according to the fifth embodiment of the present invention, the p-type gallium nitride layer 18 is formed between the silicon substrate 1 and the gallium nitride layer 2 so that a pin diode is formed between the silicon substrate 1 and the drain electrode 6.

Therefore, when a high voltage is applied to the drain electrode 6 so that avalanche breakdown occurs, a generated hole is rapidly discharged through the p-type gallium nitride layer 18 to the silicon substrate 1 so that high avalanche withstanding capability can be achieved to prevent destruction or damage of the device.

In this case, the silicon substrate 1 preferably also has the same conductive type of p-type as the p-type gallium nitride layer 18.

An indium gallium nitride (InGaN) layer may be further formed between the silicon substrate 1 and the p-type gallium nitride layer 18 in order to reduce band discontinuity between the silicon substrate 1 and the p-type gallium nitride layer 18.

Figure 9:
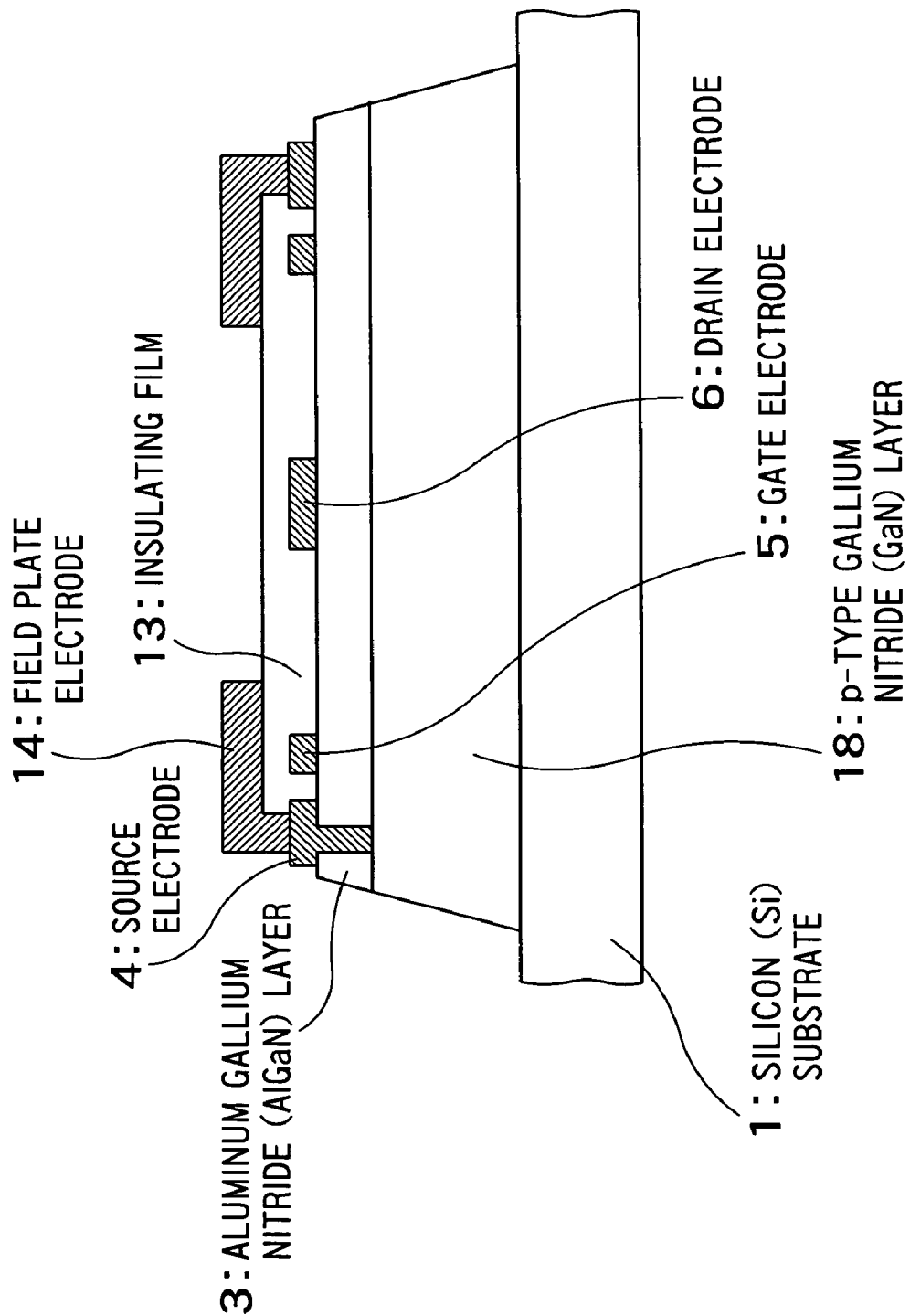
FIG. 9 is a sectional view showing a structure of a modification of the nitride semiconductor device according to the fifth embodiment of the present invention.

FIG. 9 is a sectional view showing a structure of a modification of the nitride semiconductor device according to the fifth embodiment of the present invention.

The modification shown in FIG. 9 has a structure where the nitride semiconductor device according to the fifth embodiment of the present invention shown in FIG. 8 is partially changed, and comprises a silicon (Si) substrate 1, a p-type gallium nitride (GaN) layer 18 as a third aluminum gallium nitride ($Al_zGa_{1-z}N$ ($0 \leq z \leq 1$)) layer formed on the silicon substrate 1 in an island shape, an aluminum gallium nitride (AlGaN) layer 3 as a second aluminum gallium nitride ($Al_yGa_{1-y}N$ ($0 \leq y \leq 1$)) layer formed on the p-type gallium nitride (GaN) layer 18, a drain electrode 6 formed on the center portion of the aluminum gallium nitride layer 3, a gate electrode 5 having a circular shape formed around the drain electrode 6 on the aluminum gallium nitride layer 3, a source electrode 4 having a circular shape formed around the gate electrode 5 on the aluminum gallium nitride layer 3, an insulating film 13 which covers the aluminum gallium nitride layer 3, the gate electrode 5 and the drain electrode 6, and a field plate electrode 14 which covers an area around the gate electrode 5 via the insulating film 13 and is connected to the source electrode 4.

In other words, in the modification, the entire channel layer made of the p-type gallium nitride layer 18 and the gallium nitride layer 2 in the nitride semiconductor device according to the fifth embodiment of the present invention shown in FIG. 9 is made of only the p-type gallium nitride layer 18, and the p-type gallium nitride layer 18 is connected to the source electrode 4.

Also in the structure of the modification, when a high voltage is applied to the drain electrode 6 so that avalanche breakdown occurs, a generated hole is rapidly discharged through the p-type gallium nitride layer 18 to the silicon substrate 1 so that high avalanche withstanding capability can be achieved to prevent destruction or damage of the device.

Figure 10:
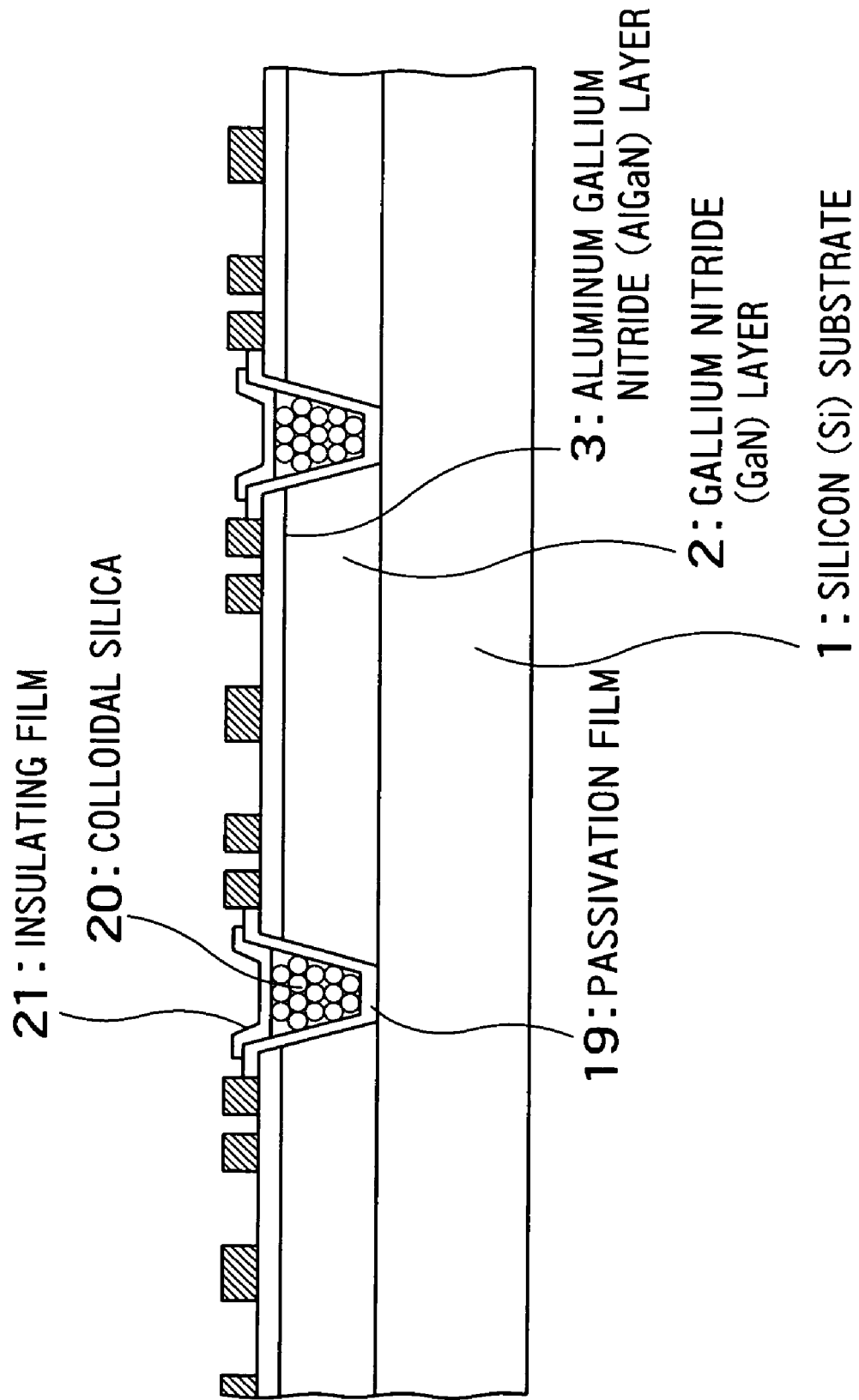
FIG. 10 is a sectional view showing a structure of a nitride semiconductor device according to a sixth embodiment of the present invention.

FIG. 10 is a sectional view showing a structure of a nitride semiconductor device according to a sixth embodiment of the present invention.

The nitride semiconductor device according to a sixth embodiment of the present invention comprises a silicon (Si) substrate 1, a gallium nitride (GaN) layer 2 as a first aluminum gallium nitride ($Al_xGa_{1-x}N$ ($0 \leq x \leq 1$)) layer formed on the silicon substrate 1 in an island shape, an aluminum gallium nitride (AlGaN) layer 3 as a second aluminum gallium nitride ($Al_yGa_{1-y}N$ ($0 \leq y \leq 1$, $x<y$)) layer formed on the gallium nitride layer 2, a drain electrode 6 formed on the center portion of the aluminum gallium nitride layer 3, a gate electrode 5 having a circular shape formed around the drain electrode 6 on the aluminum gallium nitride layer 3, a source electrode 4 having a circular shape formed around the gate electrode 5 on the aluminum gallium nitride layer 3, a passivation film 19 formed on the inner surface of a grooved element isolation area formed around the gallium nitride layer 2 and the aluminum gallium nitride layer 3 which are formed in the island shape, colloidal silica 20 as an insulation member embedded in the grooved element isolation area on which the passivation film 19 is formed, and an insulating film 21 which covers the grooved element isolation area in which the colloidal silica 20 is embedded.

In other words, the nitride semiconductor device according to the sixth embodiment of the present invention is constructed so that the passivation film 19 is formed on the inner surface of the grooved element isolation area between the island-shaped device areas to embed the colloidal silica 20 and the insulating film 21 is formed as a cap member of the grooved element isolation area.

In a manufacturing step of the nitride semiconductor device according to each embodiment of the present invention, the gallium nitride layer 2 and the aluminum gallium nitride layer 3 are crystal-grown to be formed in the island shape, and then a lithography step is performed when forming an electrode pattern. At this time, when the grooved element isolation area remains between the island-shaped device areas, a resist enters the groove and remains after the lithography step, which causes a source of contamination.

In the nitride semiconductor device according to the sixth embodiment of the present invention, after the gallium nitride layer 2 and the aluminum gallium nitride layer 3 are crystal-grown to be formed in the island shape, the passivation film 19 is deposited to be formed on the inner surface of the grooved element isolation area between the island-shaped device areas, and then the colloidal silica 20 is embedded to be flattened and the insulating film 21 is deposited to be formed as a cap layer.

With the above structure, a step corresponding to the thickness of the island-shaped crystal film present on the silicon substrate 1 is reduced to 1 µm or less to be flattened so that a material causing contamination is prevented from entering the grooved element isolation area, and the grooved element isolation area is embedded by an insulation member so that a sidewall of the island-shaped device area is made stable, thereby achieving a vertical device.

Figure 11:
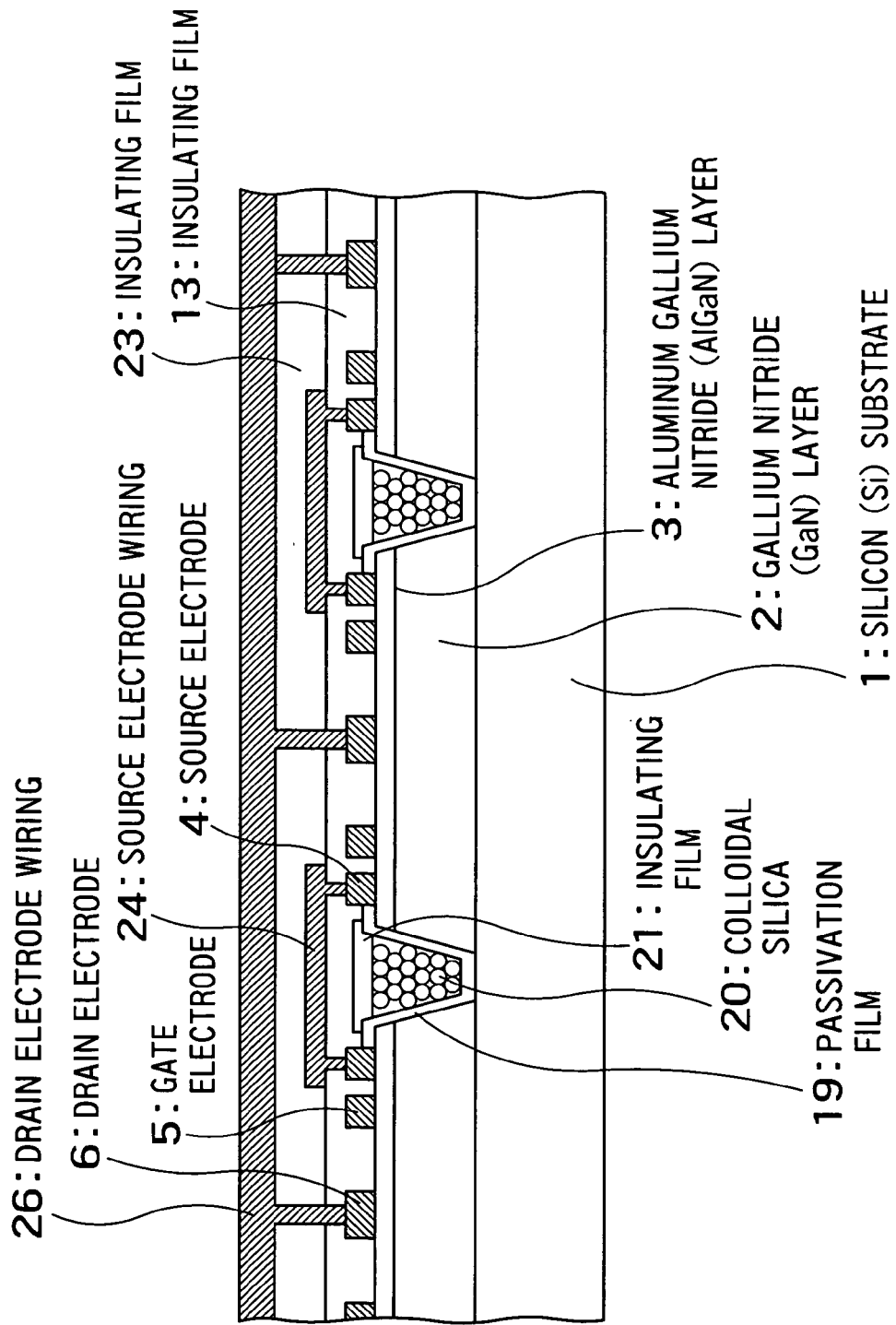
FIG. 11 is a sectional view showing a structure of a modification of the nitride semiconductor device according to the sixth embodiment of the present invention.

FIG. 11 is a sectional view showing a structure of a modification of the nitride semiconductor device according to the sixth embodiment of the present invention.

The modification shown in FIG. 11 has a structure where the nitride semiconductor device according to the sixth embodiment of the present invention shown in FIG. 10 is partially changed, and comprises a silicon (Si) substrate 1, a gallium nitride (GaN) layer 2 as a first aluminum gallium nitride ($Al_xGa_{1-x}N$ ($0 \leq x \leq 1$)) layer formed on the silicon substrate 1 in an island shape, an aluminum gallium nitride (AlGaN) layer 3 as a second aluminum gallium nitride ($Al_yGa_{1-y}N$ ($0 \leq y \leq 1$, x<y)) layer formed on the gallium nitride layer 2, a drain electrode 6 formed on the center portion of the aluminum gallium nitride layer 3, a gate electrode 5 having a circular shape formed around the drain electrode 6 on the aluminum gallium nitride layer 3, a source electrode 4 having a circular shape formed around the gate electrode 5 on the aluminum gallium nitride layer 3, a passivation film 19 formed on the inner surface of a grooved element isolation area formed around the gallium nitride layer 2 and the aluminum gallium nitride layer 3 which are formed in the island shape, colloidal silica 20 as an insulation member embedded in the grooved element isolation area on which the passivation film 19 is formed, an insulating film 21 which covers the grooved element isolation area in which the colloidal silica 20 is embedded, an insulating film 13 which covers the aluminum gallium nitride layer 3, the source electrode 4, the gate electrode 5, and the drain electrode 6, a source electrode wiring 24 which connects the source electrode 4 in one device with the source electrode 4 in the other device via the openings provided at the insulating film 13 on the source electrodes 4, an insulating film 23 which covers the source electrode wiring 24, a drain electrode wiring 26 which connects the drain electrode 6 in one device with the drain electrode 6 in the other device via the openings provided at the insulating film 13 and the insulating film 23 on the drain electrodes 6, and a gate electrode wiring (not shown) which connects the gate electrode 5 in one device with the gate electrode 5 in the other electrode via the openings provided at the insulating film 13 and the insulating film 23 on the gate electrodes 5.

In other words, the modification of the nitride semiconductor device according to the sixth embodiment of the present invention comprises the source electrode wiring 24, the gate electrode wiring, and the drain electrode wiring 26 which connect the source electrode 4, the gate electrode 5, and the drain electrode 6 in one device with the source electrode 4, the gate electrode 5, and the drain electrode 6 in the other device, respectively, as additional constituents.

With the structure of the modification, a plurality of devices formed on the silicon substrate 1 are connected to each other in parallel so that a similar effect can be obtained as when the device area is increased.

The nitride semiconductor device according to the sixth embodiment of the present invention and the modification thereof shown in FIGS. 10 and 11 are explained using the colloidal silica as the insulation member embedded in the grooved element isolation area, but other granular insulation member may be employed, a liquid glass material may be spin-coated by a spin-on-glass (SOG) to form a glass layer, or a BPSG (Boro-Phospho Silicate Glass) film may be formed.

The device is explained as the aluminum gallium nitride/gallium nitride heterostructure field effect transistor (HFET), but may be the Schottky barrier diode (SBD).

Since a voltage is not applied to the sidewalls of the island-shaped gallium nitride layer 2 and aluminum gallium nitride layer 3 in a lateral device where the silicon substrate 1 and the source electrode 4 are electrically connected to each other, even when an insulation member is not embedded in the grooved element isolation area, a problem on operational performance of the device does not occur. Therefore, in this case, a semiconductor layer such as polysilicon may be embedded in the grooved element isolation area or a metal material similar as in the electrode wiring may be embedded.

The nitride semiconductor device according to the present invention is explained by illustrating the first to sixth embodiments and the modifications thereof, but the present invention is not limited to the illustrated embodiments, and the modifications which those skilled in the art can easily assume are all considered equal (equivalent) to the present invention.

For example, the first aluminum gallium nitride ($Al_xGa_{1-x}N$ ($0 \leq x \leq 1$)) layer as the channel layer is explained as the gallium nitride (GaN) layer 2 in each embodiment described above, but may be formed as the aluminum gallium nitride (AlGaN) layer having an aluminum composition ratio smaller than in the second aluminum gallium nitride ($Al_yGa_{1-y}N$ ($0 \leq y \leq 1$, x<y)) layer 3 as the barrier layer.

The thickness of the aluminum gallium nitride layer 3 may not be necessarily uniform and may be locally different, and a recess structure may be employed, such as forming an n-type gallium nitride (GaN) layer on part of the aluminum gallium nitride layer 3.

A gate threshold voltage of the heterostructure field effect transistor generally has a negative value and is a normally-on type device, but the structure of the present invention can be also applied to a normally-off type device irrespective of the gate threshold voltage.

In addition, the example where the high breakdown voltage of the device is achieved is explained using an one-step source field plate structure, but other high breakdown voltage structure such as a drain field plate structure, a multi-step field plate structure, or a resurf structure may be employed.

The heterostructure field effect transistor (HFET) and the Schottky barrier diode (SBD) are exemplified as the nitride semiconductor device including the island-shaped aluminum gallium nitride layer/gallium nitride layer heterostructure, but the structure of the present invention can be applied to the device such as MIS-HFET where the gate structure is a MIS structure, a pn diode including the p-type aluminum gallium nitride (AlGaN) layer, or JFET including only the gallium nitride layer.

The method using the selective epitaxial growth technique where a silicon nitride (SiN) film or a silicon dioxide ($SiO_2$) film is used as a mask is exemplified as a method of crystal-growing an island-shaped gallium nitride layer, but the present invention can obtain an effect by forming a device in an island shape so that the manufacturing method is not limited to the crystal growth method.

Though a superlattice structure between a gallium nitride layer, an aluminum nitride layer, and a gallium nitride layer which are grown at a low temperature and an aluminum nitride layer is used as a buffer layer when the gallium nitride layer is crystal-grown on the silicon substrate, the structure is not limited depending on a type of the buffer layer.

As described above, according to the nitride semiconductor device of each embodiment of the present invention, it is possible to provide a nitride semiconductor device such as a field effect transistor which comprises a heterostructure including a nitride semiconductor layer formed on the silicon substrate and has a high breakdown voltage of several hundreds V or more.

What is claimed is:

1. A nitride semiconductor device comprising:
   a silicon substrate;
   a first aluminum gallium nitride ($Al_xGa_{1-x}N$ ($0 \leq x \leq 1$)) layer formed as a channel layer on said silicon substrate in an island shape;
   a second aluminum gallium nitride ($Al_yGa_{1-y}N$ ($0 \leq y \leq 1$, $x<y$)) layer formed as a barrier layer of a first conductive type or i-type on said first aluminum gallium nitride layer in said island shape;
   a gate electrode formed on said second aluminum gallium nitride layer;
   a drain electrode electrically connected to said second aluminum gallium nitride layer; and
   a source electrode electrically connected to said second aluminum gallium nitride layer,
   wherein one semiconductor device is formed of said first aluminum gallium nitride layer and said second aluminum gallium nitride layer in said island shape, said source electrode being formed to surround said gate electrode and said drain electrode and formed on a peripheral portion of said second aluminum gallium nitride layer in said island shape.

2. The nitride semiconductor device according to claim 1, wherein a plurality of semiconductor devices each formed of said first aluminum gallium nitride layer and said second aluminum gallium nitride layer in said island shape are connected in parallel.

3. The nitride semiconductor device according to claim 1, wherein said source electrode is electrically connected to said silicon substrate.

4. The nitride semiconductor device according to claim 3, further comprising:
   an insulating film formed on said gate electrode; and
   a field plate electrode formed on said insulating film to cover said gate electrode and electrically connected to said source electrode.

5. The nitride semiconductor device according to claim 4, further comprising a second field plate electrode formed on said insulating film to cover an area around said drain electrode and electrically connected to said drain electrode.

6. The nitride semiconductor device according to claim 1, further comprising a third aluminum gallium nitride ($Al_zGa_{1-z}N$ ($0 \leq z \leq 1$)) layer of a second conductive type as part of said channel layer formed in said island shape between said silicon substrate and said first aluminum gallium nitride layer such that said first aluminum gallium nitride layer is stacked.

7. The nitride semiconductor device according to claim 1, further comprising:
   a passivation film formed on an inner surface of a grooved element isolation area formed around said first aluminum gallium nitride layer and said second aluminum gallium nitride layer in said island shape;
   an insulation member embedded in said grooved element isolation area on which said passivation film is formed; and
   an insulating film covering said grooved element isolation area in which said insulation member is embedded.

8. The nitride semiconductor device according to claim 1, further composing:
   an anode electrode forming a Schottky junction with said second aluminum gallium nitride layer; and
   a cathode electrode electrically connected to said second aluminum gallium nitride layer.

9. The nitride semiconductor device according to claim 8, wherein said anode electrode is formed to surround said cathode electrode.

10. The nitride semiconductor device according to claim 8, wherein said anode electrode is electrically connected to said silicon substrate.

11. The nitride semiconductor device according to claim 10, further comprising:
    an insulating film formed on said second aluminum gallium nitride layer; and
    a field plate electrode formed on said insulating film to cover an area around said anode electrode and electrically connected to said anode electrode.

12. The nitride semiconductor device according to claim 11, further comprising a second field plate electrode formed on said insulating film to cover an area around said cathode electrode and electrically connected to said cathode electrode.

13. The nitride semiconductor device according to claim 1, wherein said first aluminum gallium nitride layer and said second aluminum gallium nitride layer are formed in said island shape by selective growth.

* * * * *